(12) United States Patent
Schmidtke et al.

(10) Patent No.: US 9,748,451 B2
(45) Date of Patent: Aug. 29, 2017

(54) RADIATION-EMITTING COMPONENT, TRANSPARENT MATERIAL AND FILLER PARTICLES, AND METHOD OF PRODUCING SAME

(71) Applicant: OSRAM Opto Semiconductors GmbH, Regensburg (DE)

(72) Inventors: Kathy Schmidtke, Bad Abbach (DE); Michael Kruppa, Geisenfeld (DE); Bert Braune, Wenzenbach (DE)

(73) Assignee: OSRAM Opto Semiconductors GmbH (DE)

( * ) Notice: Subject to any disclaimer, the term of this patent is extended or adjusted under 35 U.S.C. 154(b) by 210 days.

(21) Appl. No.: 14/391,769

(22) PCT Filed: Apr. 5, 2013

(86) PCT No.: PCT/EP2013/057228
§ 371 (c)(1),
(2) Date: Oct. 10, 2014

(87) PCT Pub. No.: WO2013/153003
PCT Pub. Date: Oct. 17, 2013

(65) Prior Publication Data
US 2015/0076544 A1 Mar. 19, 2015

(30) Foreign Application Priority Data

Apr. 12, 2012 (DE) .................. 10 2012 103 159

(51) Int. Cl.
*C08K 5/5317* (2006.01)
*H01L 33/56* (2010.01)
(Continued)

(52) U.S. Cl.
CPC ............ *H01L 33/56* (2013.01); *C08G 77/395* (2013.01); *C08K 5/5406* (2013.01); *C08K 5/56* (2013.01);
(Continued)

(58) Field of Classification Search
None
See application file for complete search history.

(56) References Cited

U.S. PATENT DOCUMENTS 4,251,436 A * 2/1981 Silberberg ............. B82Y 30/00
106/462
6,159,390 A * 12/2000 Fichou ................. C09D 17/004
252/182.24
(Continued)

FOREIGN PATENT DOCUMENTS

DE 10 2004 022 565 A1 12/2005
DE 10 2007 011 427 A1 9/2008
(Continued)

OTHER PUBLICATIONS

Zhang, B. et al. "Surface Functionalization of Zinc Oxide by Carboxyalkylphosphonic Acid Self-Assembled Monolayers." Langmuir 2010, 26(6), 4514-4522.*
(Continued)

*Primary Examiner* — Richard A Huhn
(74) *Attorney, Agent, or Firm* — DLA Piper LLP (US)

(57) ABSTRACT

A radiation-emitting component includes a radiation source; a transparent material disposed in the beam path of the component and including a polymer material and filler particles, wherein the filler particles include an inorganic filler material and a phosphonic acid derivative or phosphoric acid derivative attached to a surface thereof and through which the filler particles are crosslinked with the polymer material.

10 Claims, 3 Drawing Sheets

(51) Int. Cl.
*H01L 33/64* (2010.01)
*C08G 77/395* (2006.01)
*C08K 5/54* (2006.01)
*C08K 5/56* (2006.01)
*H01L 33/50* (2010.01)
*H01L 33/58* (2010.01)
*C09C 1/40* (2006.01)
*C09C 1/36* (2006.01)
*C08K 3/36* (2006.01)
*C08K 5/52* (2006.01)
*C08K 3/22* (2006.01)
*C08K 5/5333* (2006.01)
*C08G 79/04* (2006.01)

(52) U.S. Cl.
CPC ............ *H01L 33/507* (2013.01); *H01L 33/58* (2013.01); *H01L 33/641* (2013.01); *H01L 33/644* (2013.01); *C08G 79/04* (2013.01); *C08K 3/36* (2013.01); *C08K 5/52* (2013.01); *C08K 5/5317* (2013.01); *C08K 5/5333* (2013.01); *C08K 2003/2227* (2013.01); *C08K 2003/2241* (2013.01); *C09C 1/3607* (2013.01); *C09C 1/3653* (2013.01); *C09C 1/3669* (2013.01); *C09C 1/3676* (2013.01); *C09C 1/407* (2013.01); *H01L 2224/48091* (2013.01); *H01L 2224/48227* (2013.01); *H01L 2924/12044* (2013.01); *H01L 2933/005* (2013.01); *H01L 2933/0041* (2013.01); *H01L 2933/0058* (2013.01); *H01L 2933/0075* (2013.01); *H01L 2933/0091* (2013.01)

(56) References Cited

U.S. PATENT DOCUMENTS

| | | |
|---|---|---|
| 2010/0291374 A1 | 11/2010 | Akarsu et al. |
| 2011/0068322 A1* | 3/2011 | Pickett ................... C09K 11/02 257/13 |
| 2013/0206463 A1* | 8/2013 | Boday .................. C07F 9/4012 174/258 |

FOREIGN PATENT DOCUMENTS

| | | |
|---|---|---|
| DE | 10 2010 024 758 A1 | 3/2011 |
| DE | 10 2010 041 293 A1 | 3/2012 |
| EP | 0 905 797 A2 | 3/1999 |
| EP | 2 159 242 A1 | 3/2010 |
| JP | 2006-063191 A | 3/2006 |
| JP | 2007-314773 | 12/2007 |
| JP | 2009-024117 | 2/2009 |
| JP | 2009024117 A * | 2/2009 |
| JP | 2009-164275 | 7/2009 |
| JP | 2010-030179 | 2/2010 |
| JP | 2010030179 A * | 2/2010 |
| WO | 93/25611 A1 | 12/1993 |
| WO | 98/12757 A1 | 3/1998 |
| WO | 02/13281 A1 | 2/2002 |
| WO | WO 2007068685 A1 * | 6/2007 ........... C09D 183/04 |

OTHER PUBLICATIONS

Nakatsuka, T. et al. "Phosphate Coupling Agents for Calcium Carbonate Filler." J. Applied Polymer Sci. 1982, 27, 259-269.*
English translation of the Notification of Reasons for Refusal dated Oct. 5, 2015 of corresponding Japanese Application No. 2015-504910.

* cited by examiner

RADIATION-EMITTING COMPONENT, TRANSPARENT MATERIAL AND FILLER PARTICLES, AND METHOD OF PRODUCING SAME

TECHNICAL FIELD

This disclosure relates to a radiation-emitting component comprising a transparent material, and the transparent material itself, to crosslinkable filler particles for the transparent material and to processes of producing the radiation-emitting component, the transparent material and the filler particles.

BACKGROUND

In radiation-emitting components, for example, in LEDs, the radiation source is frequently encased with a transparent polymer encapsulation to protect it from harmful environmental influences and to homogeneously emit the radiation. The polymers are frequently silicones, since they are easy to process. However, the polymers generally have only a low thermal conductivity (about 0.15 to 0.20 W/mK), and so there may be overheating or a heat buildup in the component, for example, when the component is operated at high currents. Such overheating can lead to premature aging of the polymer which is manifested, for example, by yellowing or cracks, which can lead to premature aging extending as far as failure of the component. Sometimes, fillers are added to the transparent polymer to modify the thermal conductivity or the optical properties of the encapsulation. However, those conventional fillers have a tendency to sediment or to agglomerate in the course of manufacturing of the polymer encapsulation, and so they are not homogeneously distributed in the polymer. This can lead to adverse emission characteristics of the component.

It could therefore be helpful to provide a radiation-emitting component which reduces the abovementioned disadvantages and includes an improved transparent material with filler particles. It could further be helpful to provide the transparent material itself, filler particles for the transparent material and processes of producing each of the radiation-emitting components, the transparent material and the filler particles.

SUMMARY

We provide a radiation-emitting component including a radiation source, a transparent material disposed in the beam path of the component and including a polymer material and filler particles, wherein the filler particles include an inorganic filler and a phosphonic acid derivative or phosphoric acid derivative attached to a surface thereof and through which the filler particles are crosslinked with the polymer material, wherein the transparent material is obtained by crosslinking the filler particles with the polymer material, and reacting the polymer material with a phosphonic acid derivative or a phosphoric acid derivative having a structure represented by Formulae Ia and/or Ib

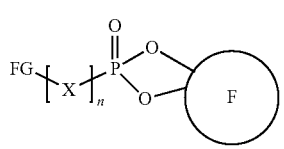

Ia

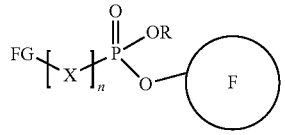

Ib where
n=0 or 1,
X is a spacer group,
R=H, alkyl, aryl, arylalkyl or silyl, and
FG is a crosslinkable group or a leaving group,
wherein, in Formulae Ia and Ib, X in the $P-[X]_n-$ fragment is at least one selected from the group consisting of alkylene, arylalkylene, alkylarylene, arylene, alkylene-O-alkylene, O-alkylene, O-arylalkylene, O-alkylarylene, O-arylene and O-alkylene-O-alkylene,
wherein, in Formulae Ia and Ib, FG in the $P-[X]_n$-FG fragment is at least one selected from the group consisting of vinyl, epoxyethyl, glycidyl, O-vinyl, O-allyl, O-alkenyl, O-epoxyalkyl, O-glycidyl, O-alkyl, O-aryl, S-alkyl, S-aryl and halogen.

We also provide a process of producing a transparent material, including A) providing a polymer material, B) providing filler particles including an inorganic filler material and a phosphonic acid derivative or phosphoric acid derivative attached to a surface thereof, C) producing a mixture including the polymer material and the filler particles, D) curing the mixture by crosslinking the polymer material with the filler particles via the attached phosphonic acid derivative or phosphoric acid derivative to obtain the transparent material.

We further provide filler particles including an inorganic filler material and a phosphonic acid derivative or phosphoric acid derivative attached to a surface thereof, having a structure represented by Formulae Ia and/or Ib

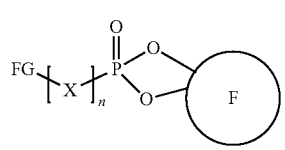

Ia

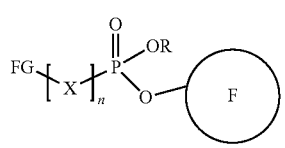

Ib where
n=0 or 1,
X is a spacer group,
R=H, alkyl, aryl, arylalkyl or silyl, and
FG is a crosslinkable group or a leaving group.

DETAILED DESCRIPTION

Figure 1:
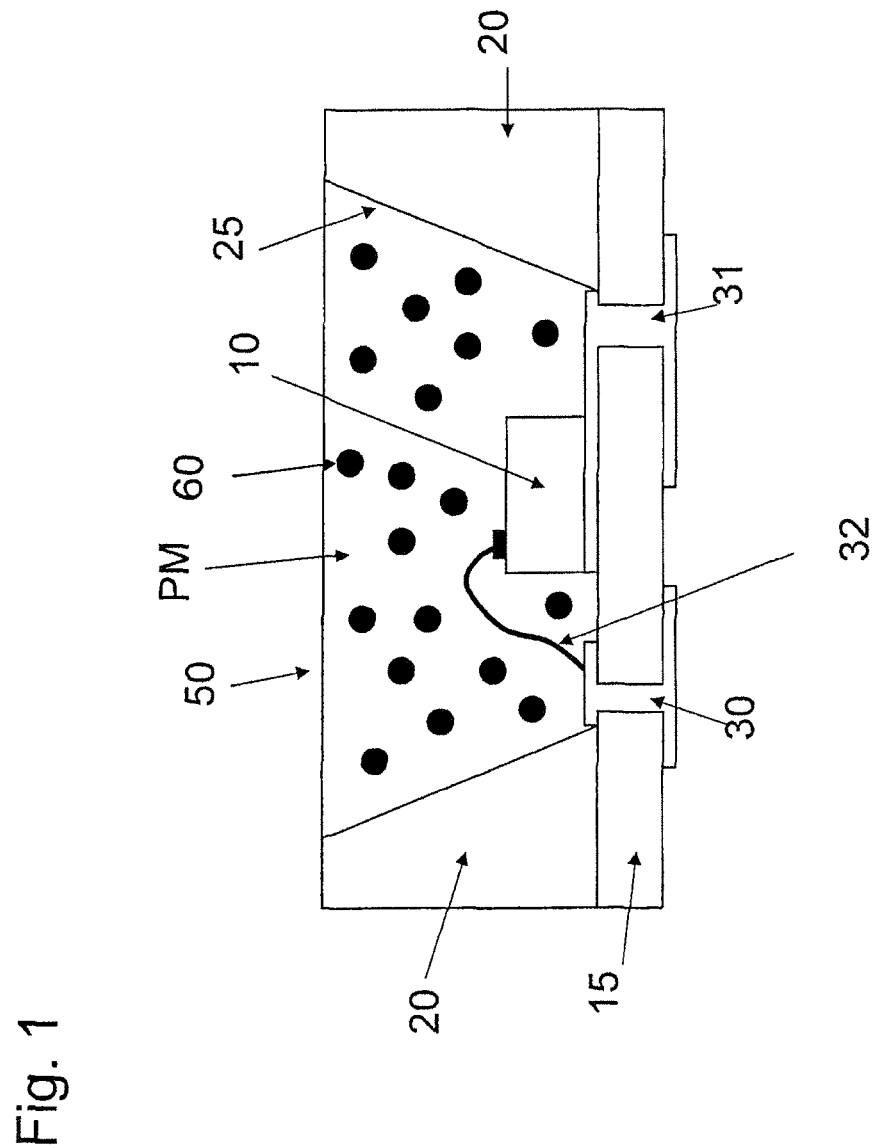
FIG. 1 shows a schematic cross section through a component in at least one example.

We provide a radiation-emitting component. The radiation-emitting component may comprise:
a radiation source;
a transparent material disposed in the beam path of the component and comprises a polymer material and filler particles;
wherein the filler particles comprise an inorganic filler material and a phosphonic acid derivative or phosphoric acid derivative attached to the surface thereof and through which the filler particles are crosslinked with the polymer material.

The radiation-emitting component is also referred to hereinafter as "component." In operation, the component can emit electromagnetic radiation, especially light in the visible region of the spectrum (wavelength about 400 to 800 nm). The radiation emitted may have any color locus in the CIE diagram, for example, white.

According to the application, for example, for illustration purposes, the abbreviation "PM" is used for the polymer material and the abbreviation "F" for the inorganic filler material. The inorganic filler material is also referred to as "filler material."

"Beam path of the component" means possible paths through which radiation from the radiation source can pass out of or be emitted from the component. According to the application, the terms "beam path" and "beam path of the component" are used synonymously.

According to the application, "attached" and "crosslinked" mean that a first material, a first molecule, a first molecular moiety or a first atom is bonded via covalent bonds to a second material, a second molecule, a second molecular moiety or a second atom. Synonyms for covalent bonding are atomic bond or electron pair bond. Synonyms for molecular moiety may be motif, fragment or atom group. Noncovalent interactions, for example, van der Waals interactions, hydrogen bonds, ionic or dipolar interactions, are insufficient according to the application for "attachment" or "crosslinking" Noncovalent interactions are generally weaker than a covalent bond. It is, however, possible for one or more noncovalent interactions to be present additionally as well as the covalent bond.

In the transparent material or in a filler particle, a phosphonic acid derivative or phosphoric acid derivative is thus, according to the application, attached via at least one covalent bond to a filler particle. In the transparent material, the polymer material is likewise crosslinked with the filler particle via at least one covalent bond via the phosphonic acid derivative or phosphoric acid derivative. It is especially possible for a phosphonic acid derivative to be attached to the filler particles, since the latter can be more stable against decomposition than a corresponding phosphoric acid derivative. It is possible for a plurality of phosphonic acid derivatives and/or phosphoric acid derivatives to be attached to a filler particle.

The transparent material is at least partly transparent to the radiation emitted by the component. The relative transmission may be at least 50%, especially at least 70%. In general, the transmission of the transparent material is greater than 80%. The transparent material may be part of an optical element, or form the entirety thereof. Such an optical element or the transparent material may take the form, for example, of a lens.

The crosslinking of the filler particles with the polymer material fixes the filler particles (in relative terms) in the transparent material. Advantageously, it is possible to achieve an exceptionally homogeneous distribution of the filler particles in the transparent material. This can be accomplished, for example, by crosslinking the filler particles with the polymer material during the production of the transparent material. Sedimentation or agglomeration of the filler particles is thus significantly reduced or avoided in the transparent material. Advantageously, this effect may be independent of the size of the filler particles since they may also have more attached phosphonic acid derivatives or phosphoric acid derivatives with increasing size. This means that both exceptionally small filler particles (for example, in the nanometer range) and large filler particles (for example, in the micrometer range) may be homogeneously distributed in the transparent material. The specific properties of the filler particle, for example, a light-scattering and/or heat-dissipating effect, are thus also distributed particularly homogeneously over the entire transparent material. In the case of light-scattering filler particles, it is thus possible to achieve particularly homogeneous emission characteristics for the radiation emitted by the component. It is additionally possible to obtain a stable color locus in the CIE diagram. With heat-conducting filler particles, it is possible to homogeneously distribute and remove heat such that overheating or a heat buildup is reduced or avoided. This improves especially the stability and lifetime of the component.

The component may be or comprise a light-emitting diode (LED) or an organic light-emitting diode (OLED). The component is or comprises especially an LED.

The component may have a housing in which the radiation source is disposed. The housing may, for example, be a flat substrate or else include a recess having optionally sloped, reflective side walls. The housing may be bonded to or may comprise a carrier substrate. In addition, the component may comprise electrically conductive connections, for example, conductive tracks, bonding pad, bonding wire or electrodes to form contacts with the radiation source. The radiation source may especially be disposed in a recess of the housing.

The radiation source may comprise or consist of a chip comprising semiconductor materials. Such a chip may, for example, be a thin-film light-emitting diode chip. Examples of thin-film light-emitting diode chips are described in EP 0905797 A2 and in WO 02/13281 A1, the subject matter of both of which are incorporated herein by reference. A thin-film light-emitting diode chip is a Lambertian radiator to a good approximation and is therefore of good suitability for lighting or for use in a floodlight, for instance a motor vehicle headlamp.

The transparent material may be an encapsulation which at least partly encases the radiation source. The radiation source may thus be partially or completely encased directly by the transparent material. If the radiation source is disposed in the recess of a housing, the recess may be partially or completely filled by the transparent material.

The transparent material may be in thermally conductive contact with the radiation source. Thus, heat arising in the course of operation of the radiation source can be removed via the transparent material. The crosslinking, i.e., the direct binding of the filler particles to the polymer material, allows an increase in the thermal conductivity of the transparent material compared to a conventional polymer material in which only a corresponding filler material without such binding is dispersed since the direct binding enables better heat transport. In general, the inorganic filler material has a higher thermal conductivity than the polymer material.

The transparent material may be obtainable by crosslinking the filler particles with the polymer material, by reacting the polymer material with a phosphonic acid derivative or a phosphoric acid derivative having a structure represented by Formulae Ia and/or Ib

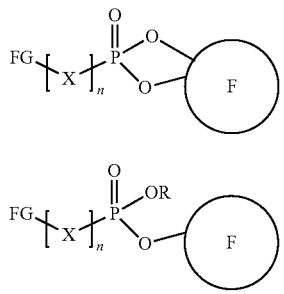

where
n=0 or 1,
X is a spacer group,
R=H, alkyl, aryl, arylalkyl or silyl, and
FG is a crosslinkable group or a leaving group.

It is also possible for combinations comprising a plurality of derivatives of Formulae Ia and/or Ib to be present. The phosphonic acid derivative or phosphoric acid derivative may especially have a structure of Formula Ia.

Phosphonic acid derivatives or phosphoric acid derivatives having a structure which is represented by Formulae Ia or Ib may be attached to different filler particles or to the same filler particle. It is possible, for example, to attach the phosphonic acid derivative or phosphoric acid derivative to the filler material by a condensation reaction. In this case, the phosphonic acid derivative or phosphoric acid derivative of Formula Ia may be formed by complete condensation, and that of Formula Ib by partial condensation. More particularly, complete condensation may have been effected, as a result of which the more stable phosphonic acid derivative or phosphoric acid derivative of Formula Ia is formed. A derivative of Formula Ib can also be formed, for example, by partial hydrolysis of a derivative of Formula Ia.

According to the application, a "spacer group" refers to an atom and especially a group of atoms (atom group) through which the phosphorus atom is bonded to the functional group FG. In this case, both a covalent bond to the phosphorus atom and a covalent bond to FG emanate from the spacer group. The spacer group may assume the function of a spacer to harmonize the transition from the polymer material to the inorganic filler material. In this way, it is possible to increase homogeneity in the transparent material and to reduce stresses in the material.

The functional group FG is required for the crosslinking of the polymer material with the filler particle. According to the application, "crosslinkable group" means that the functional group is conserved, for example, in modified form by reaction with the polymer material in the transparent material produced. The crosslinking may, for example, be simultaneous with the production of the transparent material. The term "leaving group" means that this group in the transparent material is no longer attached to the phosphonic acid derivative or phosphoric acid derivative, but is instead displaced in the reaction with the poly material. This can be accomplished, for example, via a substitution reaction.

In Formulae Ia and Ib, X in the P—[X]$_n$— fragment may be selected from a group consisting of alkylene, arylalkylene, alkylarylene, arylene, alkylene-O-alkylene, O-alkylene, O-arylalkylene, O-alkylarylene, O-arylene and O-alkylene-O-alkylene.

The term "fragment" indicates that this is a portion of the phosphonic acid derivative or phosphoric acid derivative of Formulae Ia and/or Ib. Alternative expressions for fragment are motif, molecular moiety, group or atom group. X is specified in the arrangement as incorporated in the P—[X]$_n$— fragment. This means that, for example, with X=O-alkylene, P—X means the arrangement P—O-alkylene. In analogous form, this notation is also used hereinafter for other atoms or atom groups.

In Formulae Ia and Ib, X in the P—[X]$_n$— fragment may be selected from a group consisting of C1-C12-alkylene, phenylene,

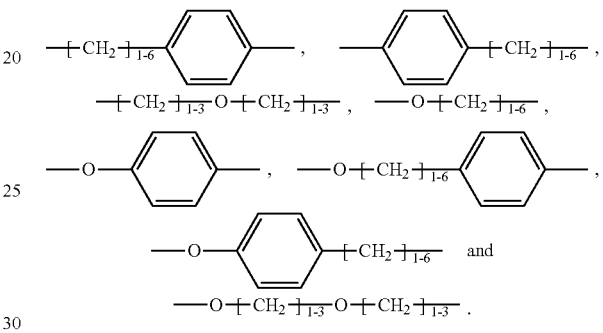

In the above structural formulae, attachment sites to the phosphorus atom or to FG are indicated by unlabeled bonds. This notation is also used hereinafter in analogous form for other atom groups.

In Formulae Ia and Ib, X in the P—[X]$_n$— fragment may be selected from a group consisting of O-alkylene, O-arylene and combinations thereof. In the P—[X]$_n$— fragment, X may especially be selected from the group consisting of

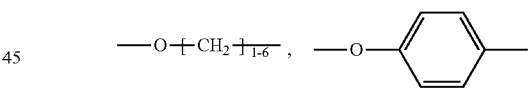

and combinations thereof.

These compounds are especially simple to prepare. The properties of the transparent material can be influenced via the alkylene and/or arylene groups, and steric advantages arise for the crosslinking with the polymer.

In Formulae Ia and Ib, X in the P—[X]$_n$— fragment may be selected from a group consisting of C1-C12-alkylene, phenylene,

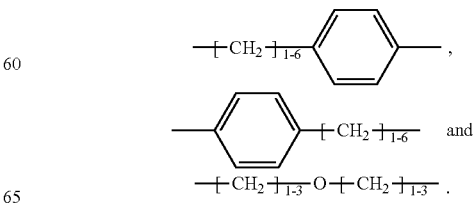

It is thus especially possible for a phosphonic acid derivative to be attached to the filler particle, since the latter can be more stable to decomposition than a corresponding phosphoric acid derivative.

In Formulae Ia and Ib, FG in the P—[X]$_n$— fragment may be selected from a group consisting of vinyl, epoxyethyl, glycidyl, O-vinyl, O-allyl, O-alkenyl, O-epoxyalkyl, O-glycidyl, O-alkyl, O-aryl, S-alkyl, S-aryl and halogen. Halogen here is selected from F, Cl, Br and I, where the halogen may especially be Cl. It is possible that FG=Cl, since the latter is a good leaving group.

Elements from the aforementioned group containing an olefinic C—C double bond or an epoxide function may be crosslinkable groups, while the elements O-alkyl, O-aryl, S-alkyl, S-aryl and halogen are generally leaving groups. This is in accordance with the above-specified definition of "crosslinkable group" and "leaving group."

In Formulae Ia and Ib, FG in the P—[X]$_n$— fragment may be selected from a group consisting of vinyl, epoxyethyl, glycidyl, O-vinyl, O-allyl, O-glycidyl, O-phenyl and

In Formulae Ia and Ib, [X]$_n$-FG in the P—[X]$_n$-FG fragment may be selected from a group consisting of vinyl, allyl, epoxyethyl, glycidyl, O-vinyl, O-glycidyl,

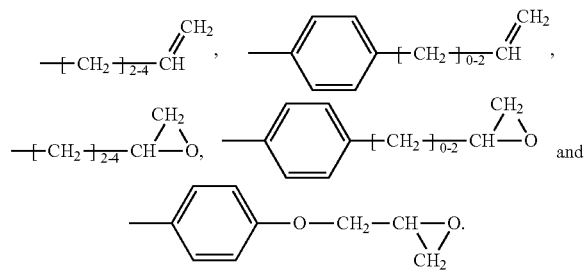

In Formulae Ia and Ib, [X]$_n$-FG in the P—[X]$_n$-FG fragment may be selected from a group consisting of vinyl, allyl, epoxyethyl, glycidyl,

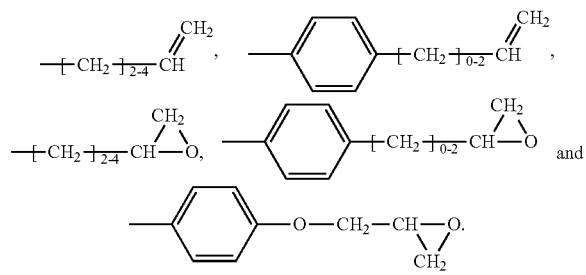

It is thus especially possible for a phosphonic acid derivative to be attached to the filler particle.

The elements of the aforementioned group all contain a functional group FG which is a crosslinkable group. For elucidation of the notation used, it should be noted that, for example, n=0 when [X]$_n$-FG=vinyl and, hence, no spacer group is present. When, for example, [X]$_n$-FG=allyl, n=1 and X=methylene, i.e., an alkylene.

Via the [X]$_n$-FG atom groups, the polymer material may have particularly good crosslinking with the filler particle. This can be accomplished, for example, through an addition reaction onto an olefinic C—C double bond or onto an epoxide function. Advantageously, crosslinking with the polymer material can be effected simultaneously with the production of the transparent material, for example, in a common curing step.

The polymer material may comprise or consist of a silicone, an epoxy resin, a silicone-epoxy hybrid material or a combination thereof. Silicone-epoxy copolymers or silicone-epoxy block copolymers are counted among the silicone-epoxy hybrid materials of the application. In the form of the polymer material, it is possible to obtain a transparent material especially suitable for an encapsulation of an LED chip. The polymer material may especially be a silicone.

The transparent material may be obtainable by crosslinking the filler particles with the polymer material, by reacting a functional group Y of the polymer material selected from a group consisting of Si—H, Si—OH and alkylene-OH with a crosslinkable group or a leaving group FG of the phosphonic acid derivative or phosphoric acid derivative, the phosphonic acid derivative or phosphoric acid derivative having a structure which is represented by Formulae Ia and/or Ib.

The functional group Y is especially matched to the functional group FG of the phosphonic acid derivative or phosphoric acid derivative. Crosslinking with FG containing an olefinic C—C double bond can be effected, for example, with a functional group Y=Si—H in a hydrosilylation. For hydrosilylations, it is possible to use platinum catalysts known per se. An Si—OH group or alkylene-OH group as functional group Y is suitable, for example, for crosslinking with a functional group FG containing an epoxide function. In addition, this functional group Y is also suitable for substitution reactions in which a leaving group is displaced from the phosphonic acid derivative or phosphoric acid derivative.

The functional group Y and the functional group FG are especially selected such that they are in good agreement with other properties of the polymer material such that there is effective crosslinking and a particularly homogeneous distribution of the filler particles in the polymer material.

The phosphonic acid derivative or phosphoric acid derivative through which the polymer material may be crosslinked with the filler particle in the transparent material has a structure represented by Formulae IIa and/or IIb

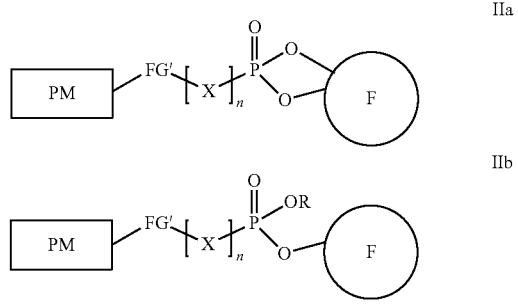

where
n=0 or 1,
X is a spacer group,
R=H, alkyl, aryl, arylalkyl or silyl, and

FG' is an atom or an atom group through which the polymer material is crosslinked with the [X]$_n$—P— fragment of the phosphonic acid derivative or phosphoric acid derivative. FG' may especially be formed by reaction of a crosslinkable group or a leaving group FG of the phosphonic acid derivative or phosphoric acid derivative having a structure represented by Formulae Ia and/or Ib, and a functional group Y of the polymer material. The spacer group X may be chosen as in other applications. The phosphonic acid derivative or phosphoric acid derivative may especially have a structure of Formula IIa.

Formulae IIa and IIb, FG' in the P—[X]$_n$-FG' fragment may be selected from a group consisting of alkylene, O-alkylene,

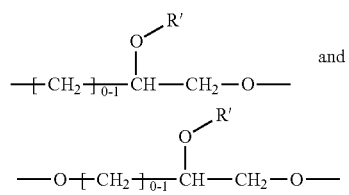

and with R'=H or polymer material. When R'=polymer material, this means that FG' is bonded to the polymer material at another point via the oxygen atom. The FG' atom group may thus also be bonded to the polymer material at two points. In FG', it is possible here for only portions of a functional group Y to be present. Further portions of Y are also counted as part of the polymer material or have been eliminated in the course of the reaction. For example, in a hydrosilylation, an Si—H function may be added onto a vinyl group, and an alkylene, more specifically ethylene, may be formed as FG', in which case the Si atom is still counted as part of the polymer material. The situation is similar for reactions with epoxide groups. FG' may especially be ethylene.

The inorganic filler material may comprise or consist of a diffuser, a heat-conducting metal oxide, a converter material or a combination thereof, especially a diffuser and/or a heat-conducting metal oxide. A diffuser or a converter material may especially contain oxygen such that the phosphonic acid derivative or phosphoric acid derivative, as illustrated, for example, in Formula Ia or Ib, can be attached to the surface of the filler material. The phosphonic acid derivative or phosphoric acid derivative advantageously has a high affinity for the filler materials, especially for metal oxides.

Heat-conducting metal oxides mean metal oxides having a thermal conductivity of at least 1.5 W/mK, especially of at least 10 W/mK. The heat-conducting metal oxides may, for example, be selected from a group consisting of crystalline $ZrO_2$, crystalline $SiO_2$ (cristobalite), crystalline $TiO_2$ (rutile, anatase) and crystalline $Al_2O_3$. These polymorphs can optionally also be used as diffusers. The refractive index of the polymer material can be matched to these fillers, such that a material which is both very transparent and has good thermal conductivity can be obtained.

The radiation emitted from the radiation source can be converted at least partly to longer wavelengths by a converter material. The choice of converter materials is not limited in accordance with the application, it being possible to use oxygen-containing converter materials in particular for the attachment to the phosphonic acid derivative or phosphoric acid derivative. Suitable converter materials are described, for example, in WO 98/12757 A1, the subject matter of which is incorporated herein by reference.

The inorganic filler material may be selected from a group consisting of $TiO_2$, $ZrO_2$, $Al_2O_3$, $SiO_2$ and a combination thereof. In this context, "combination" can mean, for example, that different filler materials are present in different filler particles or else in the same kind of filler particles. For example, one particle may comprise a core of $TiO_2$ encased by $Al_2O_3$, as a result of which, for example, titanium-catalyzed decomposition of the polymer material can be avoided.

These filler materials are first good diffusers, and also have a high thermal conductivity compared to the polymer material. Thus, the transparent material of the application, disposed in a beam path of the component, can efficiently scatter the radiation emitted from the component since the inorganic filler material is particularly homogeneously distributed in the transparent material. Agglomeration or unwanted sedimentation of the filler particles can advantageously be reduced or avoided through the crosslinking with the polymer material in the transparent material of the application. Through the homogeneous distribution of the filler particles, it is also possible to remove excess heat energy efficiently and, in particular, homogeneously by the transparent material.

The transparent material may comprise converter materials not crosslinked with the polymer material via phosphonic acid derivatives or phosphoric acid derivatives. These converter materials may be dispersed in the transparent material. Such a transparent material can be used, for example, for volume conversion. In this case, the heat of conversion which arises in the case of conversion of short-wave radiation to longer-wave radiation can be removed via the transparent material crosslinked with filler particles. This achieves improved efficiency of the converter material or of the radiation-emitting component. Overheating or a heat buildup in the component can advantageously be reduced or avoided because of the filler particles, which generally have good thermal conductivity.

The component may comprise a conversion element. Such a conversion element may be arranged, for example, in the form of a platelet on the radiation source, for example, an LED chip. In general, the converter material in a conversion element is not crosslinked with a phosphonic acid derivative or phosphoric acid derivative.

The choice of the converter materials that are not crosslinked with phosphonic acid derivatives or phosphoric acid derivatives is not limited in accordance with the application. Examples thereof are referred to in WO 98/12757 A1, the subject matter of which is incorporated herein by reference.

The transparent material may comprise up to 40% by volume, especially 5% to 35% by volume, of filler particles (% by volume=percent by volume). The transparent material may contain, for example, 20% to 35% by volume of filler particles. A high filler particle content is especially used to increase the thermal conductivity. The transparent material may also contain 5% to 20% by volume of filler particles. Such a filler particle content is used especially to adjust the emission characteristics, for example, with diffusers.

The filler particles may comprise up to 30% by weight of attached phosphonic acid derivative or phosphoric acid derivative (% by weight=percent by weight). The filler particles may comprise especially 5% to 25% by weight, for example, 20% by weight, of phosphonic acid derivative or phosphoric acid derivative. This figure is based on the total weight of the filler particles.

The filler particles may have an average diameter of 1 nm to 30 µm. The diameters are determined by a screening method.

The filler particles may have an average diameter of 1 to 200 nm. The filler particles may have an average diameter of 10 to 100 nm, especially of 10 to 40 nm. Filler particles of this size barely scatter visible light, if at all. They can especially be used to increase the thermal conductivity.

The filler particles may have an average diameter of 200 nm to 30 µm, especially 300 nm to 5 µm. Filler particles of the size can especially be used to scatter light. The polymer can be matched to the refractive index of the filler material to result in only a small difference in refractive index, or no measurable difference in refractive index at all, at operating temperature. The transparent body may, even in the case of a high content of filler particles, have a high transparency and improved thermal conductivity.

The refractive index of the polymer material is guided first by the type of polymer material since epoxy resins, for example, generally have a higher refractive index than silicones. In the case of silicones, the refractive index can be set via the choice of substituents. Poly(dimethylsiloxane), for example, has a refractive index of 1.41. With a rising proportion of higher alkyl groups and phenyl groups as substituents, the refractive index of the silicone also rises. Poly(dicyclohexylsiloxane) has a refractive index of approximately 1.48, and poly(diphenylsiloxane) of about 1.54. Through mixtures of polymer materials or combinations of substituents, it is possible to set the refractive index of the polymer material in a relatively exact manner.

We also provide a process of producing a transparent material. The process may comprise the steps of:

A) providing a polymer material;
B) providing filler particles comprising an inorganic filler material and a phosphonic acid derivative or phosphoric acid derivative attached to the surface thereof;
C) producing a mixture comprising the polymer material and the filler particles;
D) curing the mixture by crosslinking the polymer material with the filler particles via the attached phosphonic acid derivative or phosphoric acid derivative to obtain the transparent material.

Process steps A) to D) may, but need not, be conducted in the sequence specified here. Some of the process steps can also be effected simultaneously, or the order thereof can be changed. For example, steps A) and B) can be effected in any sequence. Sometimes, for example, steps C) and D) can at least partly be effected simultaneously.

The polymer material and/or the filler particles can be provided in pure form or in a medium, especially in a solvent. To produce the mixture, the polymer material and the filler particles may be present in an identical medium, i.e., an identical or at least similar solvent, which promotes mixing and crosslinking. It is optionally possible to add a solvent in step C). In addition, the mixture can be produced in step C), for example, by a Speedmixer, i.e., a high-speed stirrer. Any solvent present can be removed in step D).

The transparent material, the polymer material, the filler particles, the filler material and/or the phosphonic acid derivative or phosphoric acid derivative attached to the surface relate to the same materials and elements as described above or below for examples of other aspects of the application as well. This also applies to the corresponding properties. These examples of the description therefore also apply to the process of producing the transparent material. The situation is similar for other processes or aspects of the application as well. Polymer materials used may be conventional compounds. For a silicone, for example, it is possible to use a two-component silicone.

Curing in process step D) can be accomplished, for example, by heating and/or with radiation. Radiation used here may, for example, be UV radiation. In curing, it is possible, for example, to crosslink molecules of the polymer material with one another and with the filler particles via the attached phosphonic acid derivative or phosphoric acid derivative.

Curing may be effected by heating to a temperature of at least 80° C., especially at least 100° C.

Advantageously, crosslinking of the molecules of the polymer material with one another and the crosslinking of the polymer material with the filler particles can be effected in the same process step. The crosslinking of the polymer material with the filler particles can thus be effected under the same reaction conditions as the crosslinking of the molecules of the polymer material with one another. This can be enabled, for example, by virtue of the phosphonic acid derivative or phosphoric acid derivative attached to the filler particles having functional groups identical or similar to a portion of the polymer material molecules.

Crosslinking of the polymer material with the filler particles can be effected within a short time span. Usually, it is sufficient that a filler particle is crosslinked with the polymer material via a portion of its attached phosphonic acid derivatives or phosphoric acid derivatives such that it is no longer able to sink or agglomerate in an unwanted manner. Complete or substantially complete crosslinking (at least 80%) can then optionally be obtained by a prolonged curing operation, for example, a few hours at temperatures above 120° C., especially above 140° C.

Curing can be effected in a plurality of temperature stages, for example, to avoid stresses and blister formation in the transparent material.

It is advantageously possible to avoid, in particular, laborious separate blending processes as required for the production of conventional transparent polymers with dispersed fillers. In conventional production processes, the filler particles which cannot be crosslinked with a polymer via phosphonic acid derivatives or phosphoric acid derivatives have to be mixed vigorously with a polymer material such that they are present in very good distribution in the polymer material. Nevertheless, in general, unwanted sinking or agglomeration cannot be avoided in a conventional operation. These disadvantages are at least partly overcome by the process according to the application for producing a transparent material.

Further additives can be added to the mixture. These additives may be chosen, for example, from a group comprising crosslinking additives, deaerating agents, adhesion promoters, thixotropic agents and combinations thereof. These additives can be chosen from conventional compounds known per se to those skilled in the art.

Thixotropic agents used may, for example, be amorphous $SiO_2$ particles, for example, having a diameter of 30 to 40 nm. Suitable adhesion promoters for silicones are, for example, silanes. Crosslinking additives used may, for example, be divinylsiloxanes.

The mixture may comprise converter materials. These need not comprise any crosslinkable phosphonic acid derivatives or phosphoric acid derivatives.

The filler particles in step B) may comprise a phosphonic acid derivative or phosphoric acid derivative attached to the surface thereof, having a structure which is represented by Formulae Ia and/or Ib

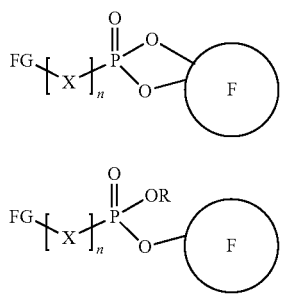

where
n=0 or 1,
X is a spacer group,
R=H, alkyl, aryl, arylalkyl or silyl, and
FG is a crosslinkable group or a leaving group. The phosphonic acid derivative or phosphoric acid derivative may especially have a structure of Formula Ia.

In step D), a transparent material may be produced in which the polymer material is crosslinked with the filler particles via a phosphonic acid derivative or phosphoric acid derivative having a structure which is represented by Formulae IIa and/or IIb. The phosphonic acid derivative or phosphoric acid derivative may especially have a structure of Formula IIa.

Providing the filler particles in step B) may comprise the following component steps:
B1) providing the inorganic filler material;
B2) applying a composition to the inorganic filler material, the composition comprising a solvent and a phosphonic acid derivative or a phosphoric acid derivative, the phosphonic acid derivative or phosphoric acid derivative having a structure which is represented by Formula III

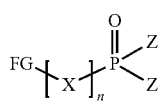

III where
n=0 or 1,
X is a spacer group,
FG is a crosslinkable group or a leaving group, and
Z=O—R or halogen, where R is independently selected from H, alkyl, aryl, arylalkyl, silyl and a cation;
B3) removing the solvent, forming filler particles having a phosphonic acid derivative or phosphoric acid derivative which is attached to the surface thereof and has a structure which is represented by Formulae Ia and/or Ib.

Halogen here is selected from F, Cl, Br and I, where the halogen may especially be Cl. The spacer group X may be selected as described for other aspects or examples.

Component steps B1) to B3) may especially be performed in the sequence specified. It is also possible, for example, for B2) and B3) to overlap in terms of time. In principle, steps B2) and/or B3) may also be conducted more than once, for example, successively to provide the filler particles with the phosphonic acid derivative or phosphoric acid derivative attached. Mixing can be effected during steps B2) and B3), for example, by a Speedmixer. In addition, it is also possible to supply energy in step B3), for example, in the form of heat and/or ultrasound, which facilitates the attachment.

Providing the filler particles with the phosphonic acid derivative or phosphoric acid derivative attached is advantageously very simple to conduct. The filler particles can also be produced separately and stored over a prolonged period. For example, the filler particles provided can be stored dry for several weeks without any significant elimination of phosphonic acid derivatives or phosphoric acid derivatives, or crosslinking of the functional group FG.

Alternatively, the providing of the filler particles in step B) comprises the following component steps:
B1) providing the inorganic filler material;
B2) applying a composition to the inorganic filler material, the composition comprising a solvent and a phosphonic acid derivative or a phosphoric acid derivative, the phosphonic acid derivative or phosphoric acid derivative having a structure which is represented by Formula III

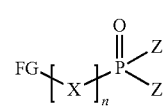

III where
n=0 or 1,
X is a spacer group,
FG is a crosslinkable group or a leaving group, and
Z=O—R or halogen, where R is independently selected from H, alkyl, aryl, arylalkyl, silyl and a cation;
B3') supplying energy, forming filler particles having a phosphonic acid derivative or phosphoric acid derivative which is attached to the surface thereof and has a structure which is represented by Formulae Ia and/or Ib.

The solvent may not be removed or may only partly be removed in step B3'), such that the filler particles are present together with the solvent.

Step B3') may be followed directly by step C). There is thus no need to isolate the filler particle. It can also be provided together with a solvent. As step C), it is possible, for example, to simply add a pure polymer material, a solution or a dispersion of the polymer material in a solvent, and to cure the mixture thereafter. The solvent may correspond to the solvent from step B2). It is generally selected at least from the same group of solvents.

Mixing can be effected during one or more of the steps, for example, B2), B3), B3') or C). This can be accomplished, for example, by a Speedmixer. In step B3'), energy can be supplied in the form of heat and/or ultrasound. Heat promotes the attachment; ultrasound prevents the formation of aggregates.

The inorganic filler material may have a hydroxyl group and/or an available oxygen atom at its surface, as is the case, for example, in most oxidic, inorganic materials, and can react thereby with the phosphorus atom of the phosphonic acid derivative or phosphoric acid derivative of Formula III in process step B3) or B3'). This is possible, for example, in the manner of a condensation reaction. In this case, in a formal sense, one or else two ROH molecule(s) and/or hydrogen halide can be eliminated, which corresponds to a partial or full condensation. More particularly, complete condensation is possible. Accordingly, it is possible to form an attached phosphonic acid derivative or phosphoric acid derivative of Formula Ia or Ib, especially of Formula Ia.

The solvent may be chosen from a group comprising water, an alcohol, an ether, an ester, a halogenated alkane, an alkane, DMF, DMSO, an aromatic hydrocarbon and a combination thereof. The solvent is especially chosen such that it is capable of good dissolution of the phosphonic acid derivative or phosphoric acid derivative of Formula III. The solvent may especially be an alcohol, a mixture of alcohols or toluene. One example of an alcohol is isopropanol.

In component step B2), the composition may be applied to the inorganic filler material by dipping, spraying or pouring. One example of spraying is spray-coating, which enables very exact, thin-film wetting of the filler material. Advantageously, it is therefore also very economically viable.

In component step B3), the solvent may be removed by heating to at least 40° C., especially to at least 60° C. The heating can accelerate component step B3), by removing the solvent more rapidly and accelerating the attachment of the phosphonic acid derivative or phosphoric acid derivative to the surface of the filler material. It is likewise possible to better remove ROH or hydrogen halide formed. It is also possible to heat to one of these temperatures in a step B3'), in which case the solvent is not removed completely.

In component step B3), the solvent may be removed by using a reduced pressure. A reduced pressure is understood in accordance with the application to mean a pressure of less than 1.0 bar. The reduced pressure used may be between 1 and 900 mbar, especially between 10 and 500 mbar. The reduced pressure simplifies or accelerates the removal of the solvent or of the ROH or hydrogen halide formed.

Providing the filler particles in step B) may comprise a further component step B4), in which the filler particles are cleaned in a washing step. Component step B4) may especially follow a step B3). Washing can be accomplished using, for example, one of the solvents as already described above. In this way, it is advantageously possible to remove residues or by-products which arise, for example, in the course of attachment of the phosphonic acid derivative or phosphoric acid derivative to the surface of the filler particles. Residues of this kind may, for example, be salts or nonvolatile solvents. Step B4) may include a removal of the solvent used for washing, for example, in B3). Step B4) can be effected during and/or at the end of step B), optionally also more than once.

One example of a process of producing a transparent material in one example is specified hereinafter. First, a dispersion of a phosphonic acid derivative or a phosphoric acid derivative of Formula III and of $SiO_2$ particles (cristobalite) as inorganic filler material is produced in isopropanol (steps B1) and B2)). Mixing can be effected by a Speedmixer, and energy can be introduced in the form of ultrasound such that no aggregates are formed (step B3')). In the course of this, there is at least partial attachment to the inorganic filler material, which results in formation of phosphonic acid derivatives or phosphoric acid derivatives of Formulae Ia and/or Ib. Then the polymer material, for example, a two-component silicone, is introduced and a mixture is produced, for which mixing is likewise effected (step C). Subsequently, curing is effected, especially in a blister-free fashion, in a plurality of different temperature stages. This also removes the solvent, and the filler particles are crosslinked with the polymer material (step D)) such that the transparent material is obtained.

We further provide a process of producing a radiation-emitting component, comprising the steps of
A0) providing a radiation source, and
B0) producing a transparent material in a beam path of the component, wherein the transparent material is produced by the process of producing the transparent material. Step B0) therefore comprises steps A) to D) already mentioned above.

Through the process of producing a radiation-emitting component, it is especially possible to obtain a component in at least one of the examples described herein. Advantageously, it especially includes a transparent material in which the filler particles are in a particularly homogeneous distribution. Unwanted sinking or agglomeration of the filler particles can be substantially or completely avoided. The advantageous properties may arise directly from the production process. Therefore, as a further aspect of the application, a radiation-emitting component is provided which is producible by the above-described process.

Filler particles may be specified. In at least one example, the filler particles comprise an inorganic filler material and a phosphonic acid derivative or phosphoric acid derivative attached to the surface thereof, having a structure which is represented by Formulae Ia and/or Ib

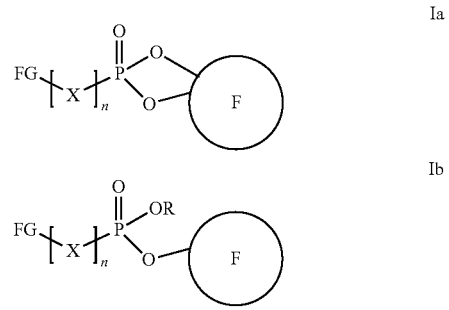

where
n=0 or 1,
X is a spacer group,
R=H, alkyl, aryl, arylalkyl or silyl, and
FG is a crosslinkable group or a leaving group.

The filler particles can be used to produce a transparent material or a component.

We further provide a process of producing filler particles comprising steps B1) to B3). The process affords filler particles as can be provided in step B).

The process may comprise an additional step B4).

We still further provide filler particles producible by the above process.

A transparent material comprises a polymer material and filler particles, wherein the filler particles comprise an inorganic filler material and a phosphonic acid derivative or phosphoric acid derivative attached to the surface thereof and through which the filler particles are crosslinked with the polymer material.

The transparent material is obtainable by a process of producing a transparent material.

Our components, materials, particles and methods are illustrated in detail hereinafter with reference to the drawings, particularly using working examples. In the drawings, elements that are identical, equivalent or have the same effect are given the same reference numerals. The figures and the size ratios of the elements shown in the figures with respect to one another should not be regarded as being to scale. Instead, individual elements may be shown in oversized and/or simplified form for better illustratability and/or for better clarity.

FIG. 1 shows a radiation-emitting component in at least one example of an LED. The component comprises a carrier substrate 15 and a housing 20 composed especially of heat- and radiation-resistant plastic, in the recess 25 of which is disposed a radiation source 10, for example, a thin-film light emitting diode chip, which emits radiation in the course of operation of the component. The side walls of the recess 25 are sloped here, and may have a reflective material. The radiation source 10 can be supplied with power through electrically conductive connections 30, 31 and a bonding wire 32. The radiation source 10 is encased by a transparent material 50 in at least one example of the application, which fills the recess 25 here as an encapsulation and is thus disposed in a beam path of the component. The beam path is not shown here for the sake of clarity. The transparent material 50 may additionally take the form of a lens (not shown). It is also possible for a separate lens of another material or a second transparent material of the application to be produced or arranged on the component (not shown).

The transparent material 50 comprises a polymer material PM selected from a silicone, an epoxy resin, a silicone-epoxide hybrid material or a combination thereof. The polymer material PM may especially be a silicone, for example, poly(dimethylsiloxane). In addition, the polymer material PM comprises filler particles 60, the filler particles 60 comprising an inorganic filler material and a phosphonic acid derivative or phosphoric acid derivative attached to the surface thereof, through which the filler particles 60 are crosslinked with the polymer material PM (not shown). Such a phosphonic acid derivative or phosphoric acid derivative can be represented by Formulae IIa and/or IIb. The filler particles 60 are homogeneously distributed in the transparent material 50, which contains barely any unwanted sedimentations and agglomerations of filler particles 60, if any at all.

The inorganic filler material may, for example, be a diffuser or a heat-conducting metal oxide and is especially selected from $TiO_2$, $ZrO_2$, $Al_2O_3$, $SiO_2$ or a combination thereof. Because of the homogeneous distribution in the transparent material 50, the component has very advantageous emission characteristics. Advantageously, it is additionally possible for the thermal conductivity of the transparent material 50 to be increased compared to a conventional encapsulation such that the component is more efficient, aging-resistant and/or long-lived.

The transparent material 50 may contain up to 40% by volume of filler particles 60. The filler particles 60 may contain up to 30% by weight of attached phosphonic acid derivative or phosphoric acid derivative and have an average diameter of 1 nm to 30 μm.

A conversion element may optionally be disposed in the beam path of the component (not shown) such that the component can emit light with any color impression, for example, white. Such a conversion element may be disposed, for example, in the form of a platelet on the radiation source 10. The choice of conversion material is not limited. It need not be crosslinked with the polymer material.

Figure 2:
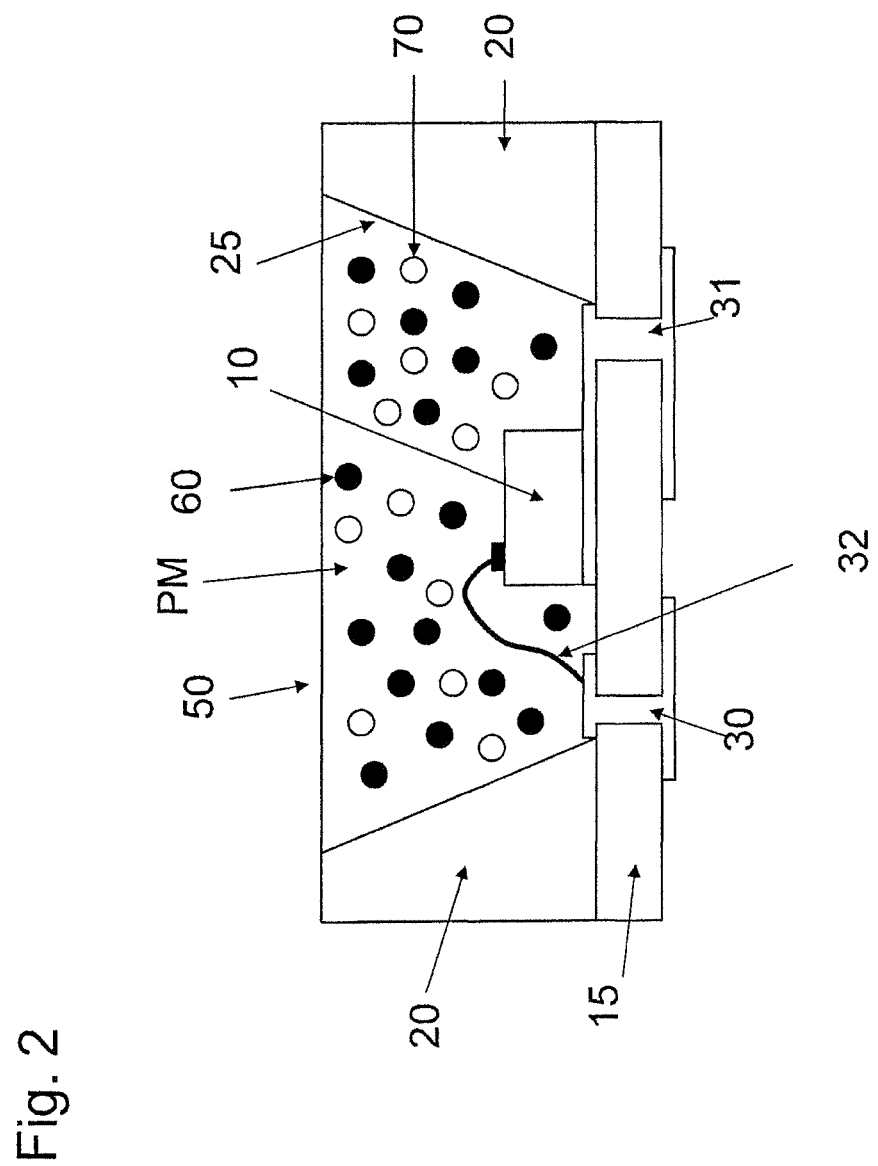
FIG. 2 shows a schematic cross section through a component in a further example.

FIG. 2 shows a component in a further example. The elements and constituents may correspond to those from FIG. 1 such that similar advantages are obtained in analogous form. In addition, particles of converter material 70 are surrounded here by the transparent material 50, i.e., dispersed therein. The converter material 70 need not be crosslinked in this case with the polymer material via phosphonic acid derivatives or phosphoric acid derivatives. Advantageously, the heat generated by conversion in the operation of the component can be removed efficiently by the converter material 70 via the transparent material 50 such that the conversion efficiency is increased and heat buildup or overheating in the component can be substantially avoided.

Figure 3:
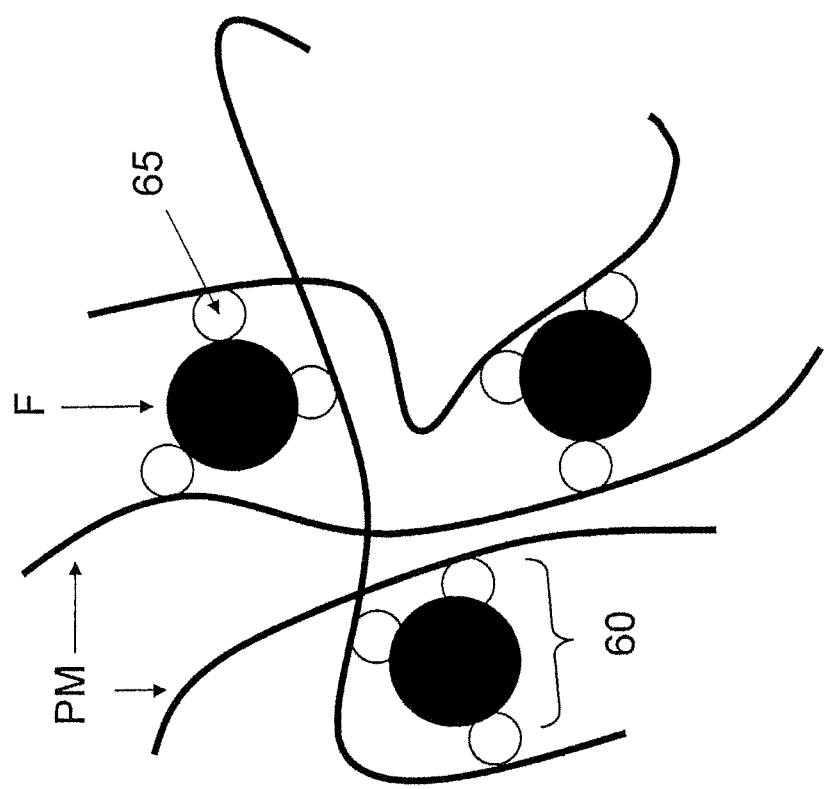
FIG. 3 shows a detail from a transparent material in at least one example.

FIG. 3 shows a schematic detail from a transparent material 50 in at least one example. In this figure, molecules of the polymer material PM are crosslinked with filler particles 60 via phosphonic acid derivatives or phosphoric acid derivatives 65. The crosslinking, or such a phosphonic acid derivative or phosphoric acid derivative 65, can be described by a structure which is represented by Formula IIa and/or Formula IIb. The filler material F may especially be selected from $TiO_2$, $ZrO_2$, $Al_2O_3$, $SiO_2$ or a combination thereof. The crosslinking may be obtainable by reaction of a functional group Y of the polymer material PM with the FG group of a phosphonic acid derivative or phosphoric acid derivative having a structure which is represented by Formulae Ia and/or Ib to form FG'.

Our components, materials, particles and methods are not limited to the working examples by the description with reference thereto. Instead, this disclosure encompasses every novel feature and every combination of features, which especially includes every combination of features in the appended claims and every combination in the working examples, even if the feature or combination itself is not specified explicitly in the claims or working examples.

The invention claimed is:
1. A radiation-emitting component comprising:
a radiation source;
a transparent material disposed in the beam path of the component and comprises a polymer material and filler particles;
wherein the filler particles comprise an inorganic filler material and a phosphonic acid derivative or phosphoric acid derivative attached to a surface thereof having a structure represented by Formulae Ia and/or Ib;

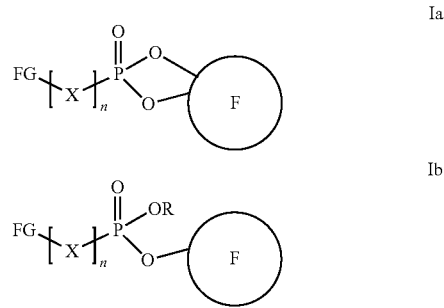

and through which the filler particles are crosslinked with the polymer material,
wherein the transparent material is obtained by crosslinking the filler particles with the polymer material, and reacting the polymer material with a phosphonic acid derivative or a phosphoric acid derivative
where
n=0 or 1,
X is a spacer group,
R=H, alkyl, aryl, arylalkyl or silyl, and
FG is a crosslinkable group or a leaving group, wherein, in Formulae Ia and Ib, X in the P—[X]$_n$— fragment is at least one selected from the group consisting of alkylene, arylalkylene, alkylarylene, arylene, alkylene-O-alkylene, O-alkylene, O-arylalkylene, O-alkylarylene, O-arylene and O-alkylene-O-alkylene, wherein, in Formulae Ia and Ib, FG in the P—[X]$_n$-FG fragment is at least one selected from the group consisting of vinyl, epoxyethyl, glycidyl, O-vinyl, O-allyl, O-alkenyl, O-epoxyalkyl, O-glycidyl, O-alkyl, O-aryl, S-alkyl, S-aryl and halogen.

2. The component according to claim 1, wherein, in Formulae Ia and Ib, [X]$_n$-FG in the P—[X]$_n$-FG fragment is at least one selected from the group consisting of vinyl, allyl, epoxyethyl, glycidyl, O-vinyl, O-glycidyl,

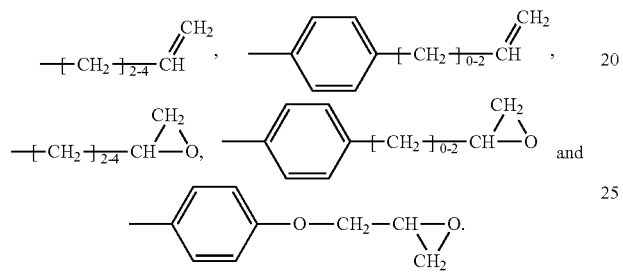

3. The component according to claim 1, wherein the polymer material comprises a silicone, an epoxy resin, a silicone-epoxide hybrid material or a combination thereof.

4. The component according to claim 3, wherein the transparent material is obtained by crosslinking the filler particles with the polymer material, and reacting a functional group Y of the polymer material selected from the group consisting of Si—H, Si—OH and alkylene-OH with a crosslinkable group or a leaving group FG of the phosphonic acid derivative or phosphoric acid derivative, the phosphonic acid derivative or phosphoric acid derivative having a structure which is represented by Formulae Ia and/or Ib.

5. The component according to claim 1, wherein the inorganic filler material comprises a diffuser, a heat-conducting metal oxide, a converter material or a combination thereof.

6. A process of producing a transparent material for a radiation-emitting component, comprising:
A) providing a polymer material;
B) providing filler particles comprising an inorganic filler material and a phosphonic acid derivative or phosphoric acid derivative attached to a surface thereof;
C) producing a mixture comprising the polymer material and the filler particles;
D) curing the mixture by crosslinking the polymer material with the filler particles via the attached phosphonic acid derivative or phosphoric acid derivative to obtain the transparent material having a structure represented by Formulae Ia and/or Ib

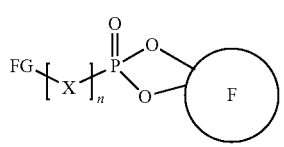

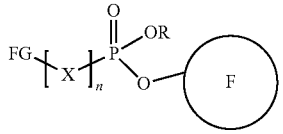

where n=0 or 1,

X is a spacer group,

R=H, alkyl, aryl, arylalkyl or silyl, and

FG is a crosslinkable group or a leaving group, wherein, in Formulae Ia and Ib, X in the fragment is at least one selected from the group consisting of alkylene, arylalkylene, alkylarylene, arylene, alkylene-O-alkylene, O-alkylene, O-arylalkylene, O-alkylarylene, O-arylene and O-alkylene-O-alkylene, wherein, in Formulae Ia and Ib, FG in the P—[X]$_n$-FG fragment is at least one selected from the group consisting of vinyl, epoxyethyl, glycidyl, O-vinyl, O-allyl, O-alkenyl, O-epoxyalkyl, O-glycidyl, O-alkyl, O-aryl, S-alkyl, S-aryl and halogen; and E) disposing the transparent material in a beam path of the radiation-emitting component.

7. The process according to claim 6, wherein providing the filler particles in step B) comprises:

B1) providing the inorganic filler material;

B2) applying a composition to the inorganic filler material, said composition comprising a solvent and a phosphonic acid derivative or a phosphoric acid derivative, said phosphonic acid derivative or phosphoric acid derivative having a structure represented by the Formula III

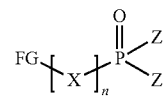

where n=0 or 1,

X is a spacer group,

FG is a crosslinkable group or a leaving group, and

Z=O—R or halogen, where R is independently selected from H, alkyl, aryl, arylalkyl, silyl and a cation;

B3) removing the solvent, forming filler particles having a phosphonic acid derivative or phosphoric acid derivative attached to a surface thereof and has a structure which is represented by Formulae Ia and/or Ib.

8. The process according to claim 6, wherein providing the filler particles in step B) comprises:

B1) providing the inorganic filler material;

B2) applying a composition to the inorganic filler material, said composition comprising a solvent and a phosphonic acid derivative or a phosphoric acid derivative, said phosphonic acid derivative or phosphoric acid derivative having a structure represented by the Formula III

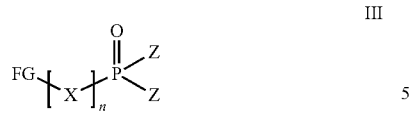

III where
n=0 or 1,
X is a spacer group,
FG is a crosslinkable group or a leaving group, and
Z=O—R or halogen, where R is independently selected from H, alkyl, aryl, arylalkyl, silyl and a cation;
B3') supplying energy, forming filler particles having a phosphonic acid derivative or phosphoric acid derivative attached to the surface thereof and has a structure represented by Formulae Ia and/or Ib.

9. The process according to claim 6, further comprising:
A0) providing a radiation source, and
B0) producing a transparent material in a beam path of the component.

10. The process according to claim 9, wherein the transparent material comprises a polymer material and filler particles,
wherein the filler particles comprise an inorganic filler material and a phosphonic acid derivative or phosphoric acid derivative attached to a surface thereof and through which the filler particles are crosslinked with the polymer material.

* * * * *